(12) United States Patent
Sugiura et al.

(10) Patent No.: US 8,779,840 B2
(45) Date of Patent: Jul. 15, 2014

(54) HIGH FREQUENCY SWITCH

(75) Inventors: Tsuyoshi Sugiura, Yokohama (JP); Eiichiro Otobe, Yokohama (JP); Koki Tanji, Yokohama (JP); Norihisa Otani, Yokohama (JP)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 221 days.

(21) Appl. No.: 13/355,292

(22) Filed: Jan. 20, 2012

(65) Prior Publication Data

US 2012/0154017 A1   Jun. 21, 2012

(51) Int. Cl.
*H03K 17/693* (2006.01)

(52) U.S. Cl.
USPC ............................. 327/427; 327/436; 327/365

(58) Field of Classification Search
USPC ......................................... 327/427, 436, 365
See application file for complete search history.

(56) References Cited

U.S. PATENT DOCUMENTS

| | | | | |
|---|---|---|---|---|
| 6,094,088 | A | * | 7/2000 | Yano ............................. 327/534 |
| 7,890,063 | B2 | * | 2/2011 | Ahn et al. ...................... 455/78 |
| 8,395,435 | B2 | * | 3/2013 | Cassia et al. ................. 327/436 |
| 8,441,304 | B2 | * | 5/2013 | Kinoshita et al. ............. 327/427 |

FOREIGN PATENT DOCUMENTS

| | | |
|---|---|---|
| JP | 2005-515657 | 5/2005 |
| WO | WO 03/032431 A3 | 4/2003 |
| WO | 2008133620 A1 | 11/2008 |

OTHER PUBLICATIONS

Japanese Office Action issued in Japanese Application No. 2010-283709 dated May 20, 2014, w/English translation.

* cited by examiner

*Primary Examiner* — Hai L Nguyen
(74) *Attorney, Agent, or Firm* — McDermott Will & Emery LLP

(57) ABSTRACT

There is provided a high frequency switch capable of suppressing deterioration in distortion characteristics. The high frequency switch includes: a common port outputting a transmission signal to an antenna; a plurality of transmission ports each having the transmission signal input thereto; and a plurality of switching units each connected between the plurality of transmission ports and the common port to conduct or block the transmission signal from each of the transmission ports to the common port, wherein each of the switching units has one or more metal oxide semiconductor field effect transistors (MOSFETs) formed on a silicon substrate, and a capacitor connected between a body terminal of a MOSFET connected to the common port among the MOSFETs and a terminal of the MOSFET connected to the common port.

9 Claims, 4 Drawing Sheets

HIGH FREQUENCY SWITCH

BACKGROUND OF THE INVENTION

1. Field of the Invention

The present invention relates to a high frequency switch, and more particularly, to a high frequency switch used in a front end portion of a wireless communications apparatus.

2. Description of the Related Art

In a case in which a high frequency switch used in a front end portion of a mobile phone, or the like, is used in, for example, a global system for mobile communications (GSM) terminal, the GSM terminal outputs a large amount of power, approximately 35 dBm, and accordingly, the high frequency switch should be capable of withstanding a correspondingly large amount of power.

As the related art associated therewith, the following structure has been known: each switching unit forming a high frequency switch is configured of a plurality of series-connected field effect transistors (FETs) and voltages are evenly divided and applied to the plurality of FETs of the switching unit, whereby the withstand voltage characteristics of the high frequency switch are improved (please refer to Japanese Patent Laid-Open Publication No. 2005-515657).

However, a metal oxide semiconductor field effect transistor (MOSFET) formed on a silicon substrate has parasitic diodes provided between source and drain terminals and a body terminal. In a case of signal transmission, when power input from a switching unit of an on-port side to an antenna through a common port increases, a parasitic diode of a MOSFET adjacent to the common port, among MOSFETs configuring a switching unit of an off-port side, is conductive, whereby a phenomenon of distorting a signal waveform occurs. This phenomenon deteriorates distortion characteristics (harmonic characteristics) of a high frequency switch. However, the related art high frequency switch may not address this problem.

SUMMARY OF THE INVENTION

An aspect of the present invention provides a high frequency switch in which a capacitor is connected between a body terminal of a MOSFET connected to a common port, among MOSFETs configuring each switching unit, and a terminal (a drain terminal) connected to the common port, such that a large power transmission signal supplied from the common port to a switching unit of an off-port side is fed-forward to the body terminal to prevent a parasitic diode from being conductive, thereby suppressing deterioration in distortion characteristics of the high frequency switch.

According to an aspect of the present invention, there is provided a high frequency switch including: a common port outputting a transmission signal to an antenna; a plurality of transmission ports each having the transmission signal input thereto; and a plurality of switching units each connected between the plurality of transmission ports and the common port to conduct or block the transmission signal from each of the transmission ports to the common port, wherein each of the switching units has one or more metal oxide semiconductor field effect transistors (MOSFETs) formed on a silicon substrate, and a capacitor connected between a body terminal of a MOSFET connected to the common port among the MOSFETs and a terminal of the MOSFET connected to the common port.

That is, the high frequency switch feeds-forward a large power transmission signal input from the common port to a switching unit of an off-port to the body terminal by the capacitor, thereby preventing a parasitic diode from being conductive.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, a high frequency switch according to an embodiment of the present invention will be described in detail.

Figure 1A:
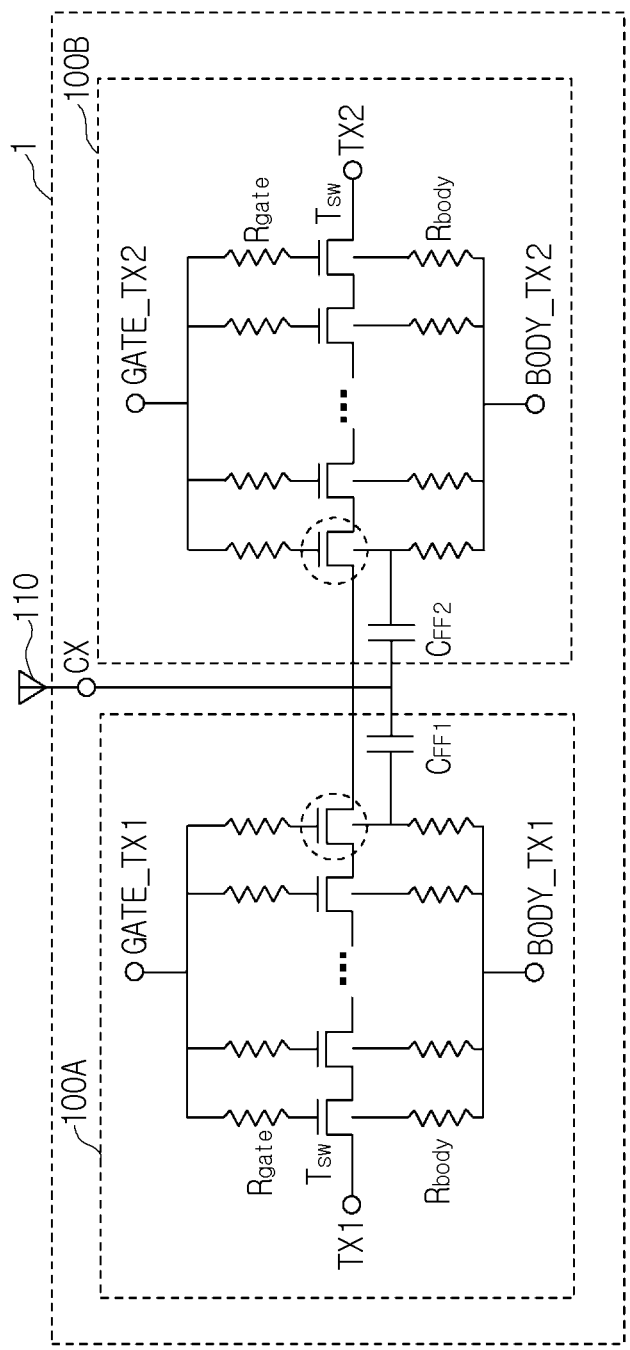
FIGS. 1A and 1B are, respectively, views showing a high frequency switch according to an embodiment of the present invention and an equivalent circuit of a MOSFET to which a feed-forward capacitor is connected.
Figure 1B:
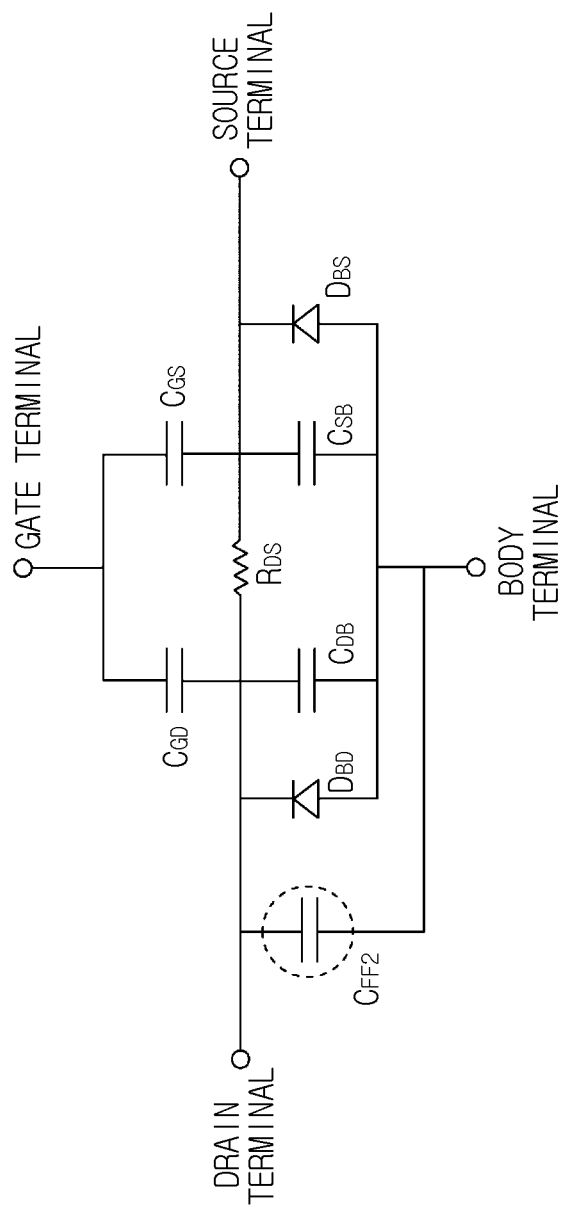

FIGS. 1A and 1B are, respectively, views showing a high frequency switch according to an embodiment of the present invention and an equivalent circuit of a MOSFET to which a feed-forward capacitor is connected.

A high frequency switch is generally used in a front end portion of a wireless communications apparatus and has a function of performing port switching according to at least one of transmission and reception switching, switching of a reception scheme, and switching of a transmission scheme. The high frequency switch according to the present embodiment may be a single pole double throw (SPDT) high frequency switch performing port switching according to the switching of the transmission scheme.

FIG. 1A is a view showing the SPDT high frequency switch according to the present embodiment. The high frequency switch according to the present embodiment may perform the port switching according to the switching of the transmission scheme.

That is, the high frequency switch according to the present embodiment may perform the switching (for example, switching between 850 MHz (a narrow band) and 1900 MHz (a wide band)) of a frequency band in a GSM terminal.

As shown in FIG. 1A, the high frequency switch 1 may include first and second switching units 100A and 100B connected in common with (in parallel with) an antenna 110 through a common port CX. The first switching unit 100A may be connected between a first transmission port TX1 and the common port CX, and the second switching unit 100B may be connected between a second transmission port TX2 and the common port CX.

The first switching unit 100A may conduct or block a first transmission signal from the first transmission port TX1 according to a control signal input to a first common gate terminal GATE_TX1.

In a conductive state, the first switching unit 100A outputs the first transmission signal (for example, a transmission signal of 850 MHz) input to the first transmission port TX1 to the common port CX. In addition, the first transmission signal is output from the common port CX to the antenna 110.

The second switching unit 100B may conduct or block a second transmission signal from the second transmission port TX2 according to a control signal input to a second common gate terminal GATE_TX2.

In a conductive state, the second switching unit 100B outputs the second transmission signal (for example, a transmission signal of 1900 MHz) input to the second transmission port TX2 to the common port CX. In addition, the second transmission signal is output from the common port CX to the antenna 110.

That is, any one of the first switching unit 100A and the second switching unit 100B conducts the transmission signal while the other blocks the transmission signal, whereby the high frequency switch 1 may perform the switching of the transmission port. Hereinafter, a switching unit in a conductive state refers to a switching unit of an on-port, and a switching unit in a non-conductive state refers to a switching unit of an off-port.

The first switching unit 100A may include a plurality of series-connected MOSFETs $T_{SW}$. Here, the MOSFET $T_{SW}$ has a source terminal and a drain terminal, which are indistinguishable from each other on a structure of the MOSFET. Therefore, in the present specification, for convenience of explanation, a terminal close to the antenna 110 in each MOSFET $T_{SW}$ of the first switching unit 100A connected to the antenna 110 will be described as the drain terminal. In addition, the "series-connected" MOSFETs $T_{SW}$ mean that any one of a source terminal and a drain terminal of one MOSFET $T_{SW}$ is connected to any one of a source terminal and a drain terminal of another MOSFET $T_{SW}$. In addition, each of the MOSFETs $T_{SW}$ will be described as an n-type MOSFET.

The MOSFET $T_{SW}$ may be formed on a silicon on insulator (SOI) substrate. Each of the MOSFETs $T_{SW}$ formed on the SOI substrate may have a structure in which FET devices formed on a silicon layer disposed on an insulation layer formed of a silicon oxide ($SiO_2$) are enclosed by the insulation layer and may be electrically separated from each other by the insulation layer formed of the silicon oxide.

The first switching unit 100A may further include gate resistors $R_{gate}$ each provided between a gate terminal of each MOSFET $T_{SW}$ and the first common gate terminal GATE_TX1, and body resistors $R_{body}$ each provided between a body (backgate, well) terminal of each MOSFET $T_{SW}$ and a first common body terminal BODY_TX1. The body resistor $R_{body}$ is provided in order to reduce loss due to power leaked from a body region.

In addition, a MOSFET $T_{SW}$ connected to the common port CX among the plurality of series-connected MOSFETs $T_{SW}$ (a MOSFET $T_{SW}$ enclosed by a dotted circle in the first switching unit 100A of FIG. 1A, hereinafter, referred to a "first leading MOSFET") includes a first feed-forward capacitor $C_{FF1}$ connected between a drain terminal and a body terminal. The first feed-forward capacitor $C_{FF1}$ serves to transfer a signal applied to the drain terminal of the first leading MOSFET to the body terminal of the first leading MOSFET $T_{SW}$.

The second switching unit 100B also has the same structure as that of the first switching unit 100A. Therefore, a description thereof will be briefly described or be omitted.

The second switching unit 100B may include a plurality of series-connected MOSFETs $T_{SW}$, gate resistors $R_{gate}$ each provided between a gate terminal of each MOSFET $T_{SW}$ and the second common gate terminal GATE_TX2, and body resistors $R_{body}$ each provided between a body terminal of each MOSFET $T_{SW}$ and a second common body terminal BODY_TX2. In addition, a MOSFET $T_{SW}$ connected to the common port CX among the plurality of series-connected MOSFETs $T_{SW}$ (a MOSFET $T_{SW}$ enclosed by a dotted circle in the second switching unit 100B of FIG. 1A, hereinafter, referred to a "second leading MOSFET") includes a second feed-forward capacitor $C_{FF2}$ connected between a drain terminal and a body terminal. The second feed-forward capacitor $C_{FF2}$ serves to transfer a signal applied to the drain terminal of the second leading MOSFET to the body terminal of the second leading MOSFET.

An operation of the high frequency switch 1 according to the present embodiment will be described.

A case in which the first switching unit 100A is an on-port and the second switching unit 100B is an off-port will be described. In addition, a case in which the first switching unit 100A is an off-port and the second switching unit 100B is an on-port may also be considered (a description of this case will be omitted).

When a high level control signal is input to the first common gate terminal GATE_TX1, all of the MOSFETs $T_{SW}$ of the first switching unit 100A are conductive. Therefore, the first switching unit 100A is switched on, such that the first transmission signal input to the first transmission port TX1 is transferred to the antenna 110 through the common port CX.

At this time, since a low level control signal is input to the second common gate terminal GATE_TX2, all of the MOSFETs $T_{SW}$ of the second switching unit 100B are switched to a non-conductive state.

Therefore, since the second switching unit 100B is switched off, even in the case in which a signal is input to the second transmission port, the signal is not transferred to the antenna 110 through the common port CX.

The first transmission signal output from the first switching unit 100A to the common port CX is also applied to the second switching unit 100B connected, together with the first switching unit 100A, with the common port CX. Particularly, the first transmission signal is directly applied to the drain terminal of the second leading MOSFET $T_{SW}$ connected to the antenna 110 among the plurality of series-connected MOSFETs $T_{SW}$ configuring the second switching unit 100B.

The equivalent circuit of the MOSFET shown in FIG. 1B may be regarded as an equivalent circuit of the second leading MOSFET $T_{SW}$ since the second feed-forward capacitor is connected thereto.

In FIG. 1B, a gate-source capacitance $C_{GS}$ indicates a capacitance between a gate terminal and a source terminal; a gate-drain capacitance $C_{GD}$ indicates a capacitance between a gate terminal and a drain terminal; a source-body capacitance $C_{SB}$ indicates a capacitance between a source terminal and a body terminal; and a drain-body capacitance $C_{DB}$ indicates a capacitance between a drain terminal and a body terminal. A body-source diode $D_{SB}$ indicates a parasitic diode by a PN junction between a body region and a source region, and a body-drain diode $D_{BD}$ indicates a parasitic diode (hereinafter, referred to as a "parasitic diode $D_{BD}$") by a PN junction between a body region and a drain region.

A drain-source resistance $R_{DS}$ is a resistance value of a channel of a MOSFET $T_{SW}$ in a non-conductive state, that is, an off-resistance value of the MOSFET $T_{SW}$, since each MOSFET of the second switching unit 100B of the off-port is in a non-conductive state.

The second leading MOSFET $T_{SW}$ includes the second feed-forward capacitor $C_{FF2}$ provided between the body terminal and the drain terminal.

Figure 2:
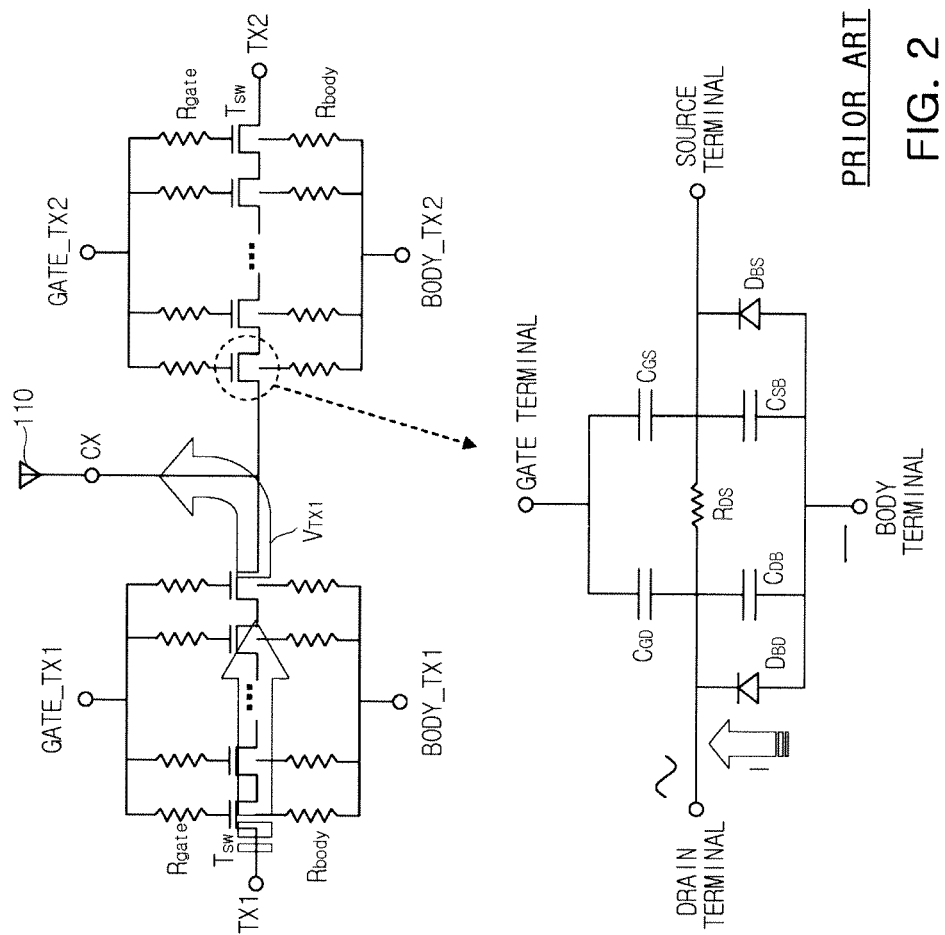
FIG. 2 is a view describing a phenomenon that a switching unit of an off-port deteriorates distortion characteristics in a high frequency switch according to the related art.

FIG. 2 is a view describing a phenomenon that a switching unit of an off-port deteriorates distortion characteristics in a high frequency switch according to the related art. An upper view of FIG. 2 shows the related art SPDT high frequency switch, and a lower view thereof shows an equivalent circuit of a MOSFET connected to a common port CX among MOSFETs configuring a switching unit of an off-port side in the high frequency switch.

In addition, the high frequency switch according to the related art shown in FIG. 2 has the same configuration as that of the high frequency switch according to the present embodiment, except that it does not include a feed-forward capacitor. Accordingly, the same reference numerals and terms as those used to describe the high frequency switch according to the present embodiment will be used to describe the high frequency switch according to the related art.

A parasitic diode $D_{BD}$ generally has a non-conductive state since voltage applied to a body terminal may be lower than that applied to a drain terminal (reverse bias). However, for example, in a GSM terminal, a first transmission signal $V_{TX1}$ having a high power of 35 dBm may be applied from a first transmission port TX1 to an antenna 110 through a common port. As a result, the first transmission signal $V_{TX1}$ is applied to a drain electrode of a second leading MOSFET $T_{SW}$ connected to the common port CX to which the first transmission signal $V_{TX1}$ is output, such that a drain terminal may have a potential lower than that of a body terminal (forward bias). In addition, when voltage exceeding threshold voltage of the parasitic diode $D_{BD}$ is applied to the parasitic diode $D_{BD}$, the parasitic diode $D_{BD}$ is conductive to voltage-clamp the first transmission signal $V_{TX1}$ output to the common port CX while simultaneously allowing current I to flow from the body terminal to the drain terminal. This distorts the first transmission signal $V_{TX1}$ to thereby deteriorate distortion characteristics of the high frequency switch.

Figure 3:
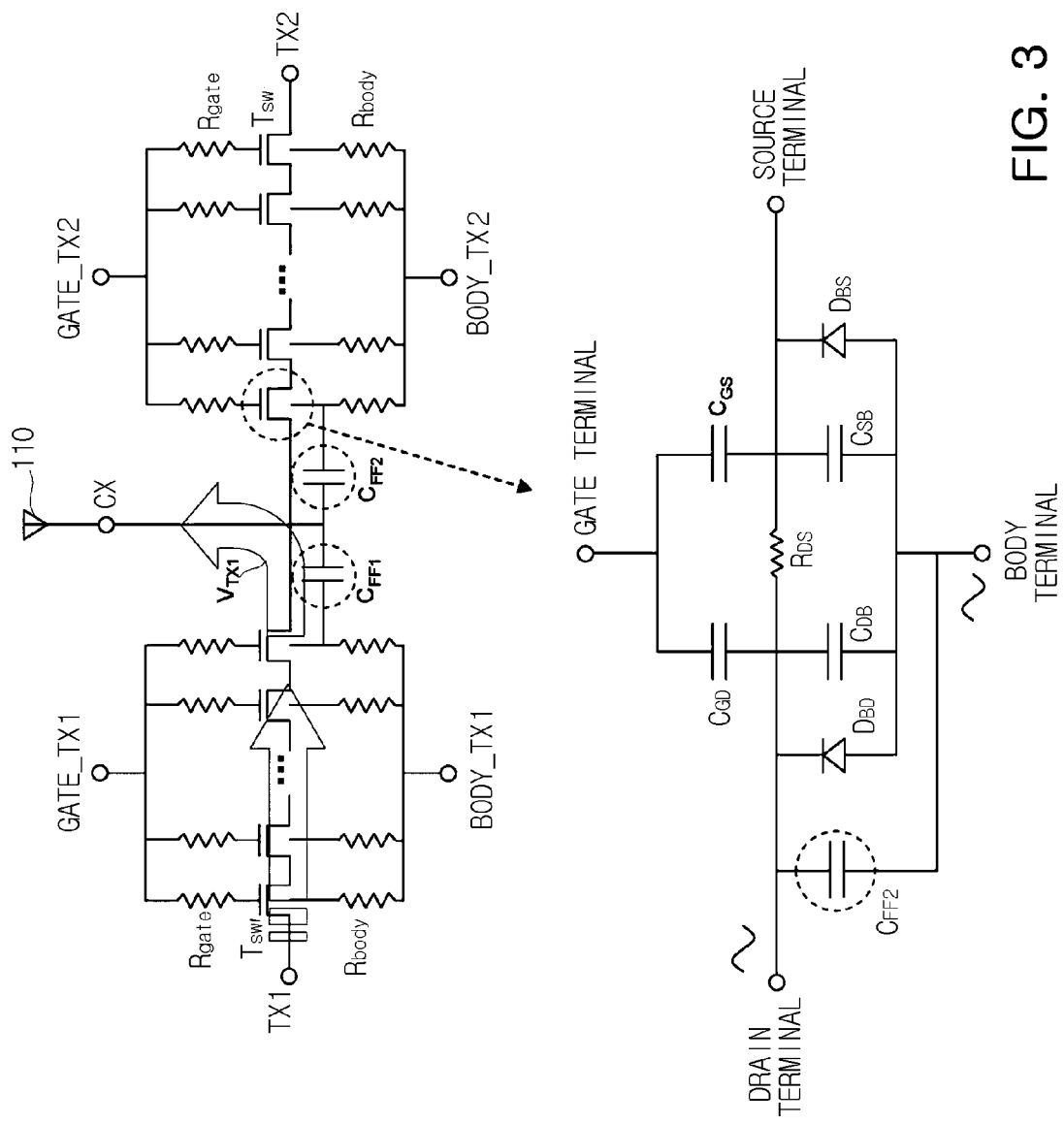
FIG. 3 is a view describing a function of a feed-forward capacitor preventing deterioration in distortion characteristics of a transmission signal in a high frequency switch according to an embodiment of the present invention.

FIG. 3 is a view describing a function of a feed-forward capacitor preventing deterioration in distortion characteristics of a transmission signal in the high frequency switch according to the present embodiment. An upper view of FIG. 3 shows the high frequency switch according to the present embodiment, and a lower view thereof shows an equivalent circuit of a second leading MOSFET.

As shown in FIG. 3, the first transmission signal $V_{TX1}$ output from the first switching unit 100A of an on-port to the common port CX, is applied to the drain terminal of the second leading MOSFET $T_{SW}$ of the second switching unit 100B of an off-port. However, according to the present embodiment, the second feed-forward capacitor $C_{FF2}$ is provided between the body terminal of the second leading MOSFET $T_{SW}$ and the drain terminal thereof. Therefore, the first transmission signal $V_{TX1}$ applied to the drain terminal of the second leading MOSFET $T_{SW}$ is fed-forward to the body terminal by the second feed-forward capacitor $C_{FF2}$. As a result, in the body terminal of the second leading MOSFET $T_{SW}$, an alternating current (AC) voltage component having the same phase as that of the drain terminal and the same amplitude as that of the drain terminal (actually, a phase and an amplitude close to those of the drain terminal) is overlapped with a direct current (DC) voltage component originally applied thereto by the second common body terminal.

In this case, an AC voltage component having the same phase and amplitude is applied to a cathode and an anode of the parasitic diode $D_{BD}$ of the second leading MOSFET $T_{SW}$.

Therefore, in the parasitic diode $D_{BD}$, reverse bias is generally maintained, and the influence due to application of the first transmission signal $V_{TX1}$ may be almost offset since the cathode and the anode have the same current component. As a result, the conduction of the parasitic diode $D_{BD}$ is prevented, whereby deterioration in distortion characteristics of the high frequency switch may be prevented.

In addition, according to the present embodiment, since the second leading MOSFET $T_{SW}$ is formed on the SOI substrate, the body region of the second leading MOSFET $T_{SW}$ is separated from those of the other MOSFETs $T_{SW}$. Therefore, the second feed forward capacitor $C_{FF2}$ is provided with the second leading MOSFET $T_{SW}$, whereby the first transmission signal $V_{TX1}$ applied to the drain terminal of the second leading MOSFET $T_{SW}$ may be effectively fed-forward to the body terminal thereof. That is, the deterioration in the distortion characteristics of the high frequency switch 1 may be more effectively prevented.

In addition, since the body resistors $R_{body}$ are individually provided in the body terminals of the MOSFETs $T_{SW}$ configuring the second switching unit 100B, the body region of the second leading MOSFET $T_{SW}$ may be more effectively separated from those of the other MOSFETs $T_{SW}$. Therefore, deterioration in the distortion characteristics of the high frequency switch 1 may be more effectively prevented.

In addition, since parasitic capacitance components and parasitic resistance components are present in the plurality of MOSFETs $T_{SW}$ configuring each switching unit 100A and 100B, voltage applied to individual MOSFETs $T_{SW}$ is not evenly divided. That is, in each switching unit 100A and 100B, voltage applied to the MOSFETs $T_{SW}$ (that is, the first and second leading MOSFETs $T_{SW}$) connected to the common port CX among the series-connected MOSFETs $T_{SW}$ is relatively large.

Therefore, even in the case in which the feed-forward capacitors $C_{FF1}$ and $C_{FF2}$ are only provided to the first and second leading MOSFETs $T_{SW}$ connected to the common port CX, among the series-connected MOSFETs $T_{SW}$ of each switching unit 100A and 100B, deterioration in the distortion characteristics of the high frequency switch 1 may be effectively prevented. Therefore, an increase in chip size generated when feed-forward capacitors are provided to the other MOSFETs $T_{SW}$ may be suppressed.

The high frequency switch according to the embodiment of the present invention has the following effects. That is, the capacitor is connected between the body terminal and the drain terminal of the MOSFET connected to the common port, among the MOSFETs configuring individual switching units connected to the common port. Therefore, the transmission signal supplied from the common port to the switching unit of the off-port is fed-forward to the body terminal to thereby prevent the parasitic diode from being conductive, whereby deterioration in distortion characteristics of the high frequency switch may be suppressed.

The present invention is not limited to the high frequency switch according to the above-described embodiments. That is, a high frequency switch according to an embodiment of the present invention may be a transmission and reception single pole 4 throw (SP4T) high frequency switch performing port switching according to the switching of the transmission and reception scheme. In addition, a high frequency switch according to an embodiment of the present invention may also be a single pole multi throw (SPMT) switch and a multi pole multi throw (MPMT).

Further, the MOSFETs of each switching unit are not limited to the n-type MOSFET, but may also be a p-type MOSFET.

In addition, the MOSFET is not limited to being formed on the SOI substrate, but may also be formed on a silicon substrate (for example, a bulk substrate) other than the SOI substrate.

Further, the number of MOSFETs configuring each switching unit is not limited to being plural, but may also be 1.

In addition, the number of MOSFETs having the feed-forward capacitor connected thereto among the MOSFETs configuring each switching unit is not limited to 1, but may also be 2 or more.

As set forth above, a high frequency switch according to embodiments of the present invention may suppress deterioration in distortion characteristics thereof.

While the present invention has been shown and described in connection with the embodiments, it will be apparent to those skilled in the art that modifications and variations can be made without departing from the spirit and scope of the invention as defined by the appended claims.

What is claimed is:

1. A high frequency switch comprising:
   a common port outputting a transmission signal to an antenna;
   a plurality of transmission ports each having the transmission signal input thereto; and
   a plurality of switching units each connected between the plurality of transmission ports and the common port to conduct or block the transmission signal from each of the transmission ports to the common port,
   wherein each of the switching units has one or more metal oxide semiconductor field effect transistors (MOSFETs) formed on a silicon substrate, and a capacitor connected between a body terminal of a MOSFET connected to the common port among the MOSFETs and a terminal of the MOSFET connected to the common port.

2. The high frequency switch of claim 1, wherein each of the switching units is configured by connecting the MOSFETs in series with each other and having the capacitor connected to the MOSFET connected to the antenna among the MOSFETs.

3. The high frequency switch of claim 2, wherein the silicon substrate is a silicon on insulator (SOI)substrate.

4. The high frequency switch of claim 2, wherein the silicon substrate is a bulk substrate.

5. The high frequency switch of claim 1, wherein each body terminal of the one or more MOSFETs is supplied with a substrate potential through one or more resistors.

6. The high frequency switch of claim 5, wherein the silicon substrate is a silicon on insulator (SOI)substrate.

7. The high frequency switch claim 5, wherein the silicon substrate is a bulk substrate.

8. The high frequency switch of claim 1, wherein the silicon substrate is a silicon on insulator (SOI)substrate.

9. The high frequency switch of claim 1, wherein the silicon substrate is a bulk substrate.

* * * * *